United States Patent
Koto

(10) Patent No.: US 7,898,292 B2
(45) Date of Patent: Mar. 1, 2011

(54) LEVEL CONVERTER

(75) Inventor: Tomohiko Koto, Kasugai (JP)

(73) Assignee: Fujitsu Semiconductor Limited, Yokohama (JP)

(*) Notice: Subject to any disclaimer, the term of this patent is extended or adjusted under 35 U.S.C. 154(b) by 43 days.

(21) Appl. No.: 12/124,808

(22) Filed: May 21, 2008

(65) Prior Publication Data

US 2008/0290902 A1 Nov. 27, 2008

(30) Foreign Application Priority Data

May 22, 2007 (JP) .............................. 2007-135675

(51) Int. Cl.
*H03K 19/094* (2006.01)
(52) U.S. Cl. .............................. 326/68; 326/80; 327/333
(58) Field of Classification Search ............. 326/68–83; 327/333
See application file for complete search history.

(56) References Cited

U.S. PATENT DOCUMENTS

| | | | | |
|---|---|---|---|---|
| 5,559,464 A | * | 9/1996 | Orii et al. | 327/333 |
| 6,650,168 B1 | * | 11/2003 | Wang et al. | 327/333 |
| 7,112,996 B2 | * | 9/2006 | Lee | 326/68 |
| 7,151,400 B2 | * | 12/2006 | Chen | 327/333 |
| 7,268,588 B2 | * | 9/2007 | Sanchez et al. | 326/68 |

FOREIGN PATENT DOCUMENTS

JP 10-336007 A 12/1998

* cited by examiner

*Primary Examiner*—Rexford N Barnie
*Assistant Examiner*—Crystal L Hammond
(74) *Attorney, Agent, or Firm*—Arent Fox LLP

(57) ABSTRACT

A level converter comprising an input circuit, coupled to a low power source and a first high power source, which generates a complementary first signal and second signal; and a shift circuit that outputs an output signal generated by shifting a voltage level of the input signal, the shift circuit including: a latch circuit having: a first inverter circuit provided in a first path between a second high power source and the low power source; and a second inverter circuit provided in a second path between the second high power source and the low power source, wherein the latch circuit is formed by coupling an input terminal and an output terminal of the first inverter circuit and the second inverter circuit; a first transistor coupled to the first path; and a second transistor coupled to the second path.

18 Claims, 8 Drawing Sheets

LEVEL CONVERTER

CROSS-REFERENCE TO RELATED APPLICATIONS

This application claims the benefit of priority from Japanese Patent Application No. 2007-135675 filed on May 22, 2007, the entire contents of which are incorporated herein by reference.

BACKGROUND OF THE INVENTION

1. Field of the Invention

This application relates to a level converter for use in a semiconductor device that operates with a plurality of power source voltages.

2. Description of the Related Art

In a recent semiconductor device, for lower power consumption, an internal circuit is configured to handle signals at levels lower than those of signals being handled in external portions of the semiconductor device. That is, operation power source voltages of the internal circuit are set lower than voltages of the signal levels being handled in the external portions of the semiconductor device. As such, an input circuit of such a semiconductor device includes a level converter that converts external signal levels to signal levels of an internal circuit. Further, an output circuit of the semiconductor device includes a level converter that converts the signal levels of the internal circuit to external signal levels. A technique related to such a level converter is disclosed in, for example, Japanese Laid-open Patent Publication No. 10-336007.

SUMMARY

One aspect includes a level converter, which includes: an input circuit, coupled to a low power source and a first high power source, which generates a complementary first signal and second signal in accordance with an input signal; and a shift circuit that outputs an output signal generated by shifting a voltage level of the input signal, the shift circuit including: a latch circuit having: a first inverter circuit provided in a first path between a second high power source and the low power source, wherein the second high power source is different from the first high power source; and a second inverter circuit provided in a second path between the second high power source and the low power source, wherein the latch circuit is formed by coupling an input terminal and an output terminal of the first inverter circuit and the second inverter circuit, and wherein the latch circuit latches the first signal and the second signal; a first transistor coupled to the first path; a second transistor coupled to the second path; and a control signal line that controls a gate potential of one of the first transistor and the second transistor.

Additional advantages and novel features of the invention will be set forth in part in the description that follows, and in part will become more apparent to those skilled in the art upon examination of the following or upon learning by practice of the invention.

DESCRIPTION OF PREFERRED EMBODIMENTS

Figure 1:
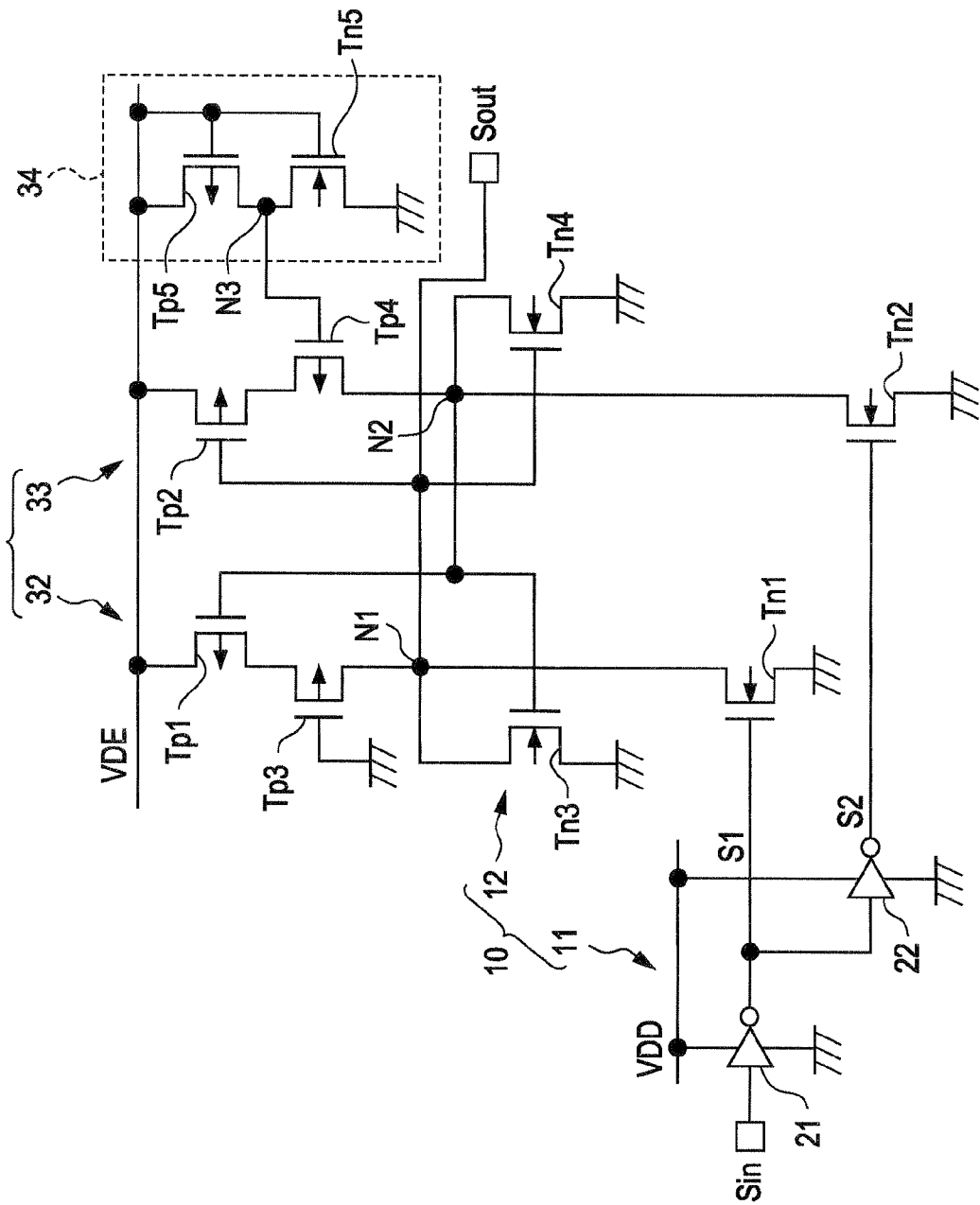
FIG. 1 is a diagram showing a first exemplary level converter circuit, in accordance with aspects of the present invention.

FIG. 1 shows a first exemplary implementation, in accordance with aspects of the present invention.

A level converter 10 shown in FIG. 1 includes an input circuit 11 and a shift circuit 12.

The input circuit 11 includes two inverter circuits 21 and 22 (first and second inverter circuits). Power source terminals of the inverter circuits 21 and 22 are, respectively, coupled to a first high power source VDD and a low power source (ground in the first exemplary implementation). The inverter circuit 21 performs inverts an input signal Sin, and outputs a signal S1 having either the first high power source VDD level (H level) or the ground level (L level). The inverter circuit 22 inverts the output signal S1 of the first inverter circuit 21, and outputs a signal S2 at having either the first high power source VDD level (H level) or the ground level (L level). In this manner, the input circuit 11 outputs the complementary signal S1 and S2 in accordance with the input signal Sin.

The signals S1 and S2 are input into the shift circuit 12. The signal S1 is supplied to the gate of an N-channel MOS transistor Tn1, and the signal S2 is supplied to the gate of an N-channel MOS transistor Tn2. The sources of the respective transistors Tn1 and Tn2 are coupled to the ground, and the drains of the respective transistors Tn1 and Tn2 are connected to a latch circuit 31.

The latch circuit 31 includes two inverter circuits 32 and 33 (first and second inverter circuits) coupled together in a ring shape. The first inverter circuit 32 includes a P-channel MOS transistor Tp1 and an N-channel MOS transistor Tn3 that are series-coupled between a second high power source VDE and the ground. The second inverter circuit 33 includes a P-channel MOS transistor Tp2 and an N-channel MOS transistor Tn4 that are series-coupled between the second high power source VDE and the ground. A node N1 between the transistors Tp1 and Tn3, which constitute the first inverter circuit 32, is coupled to the gates of the transistors Tp2 and Tp4, which constitute the second inverter circuit 33, and is coupled to the drain of the transistor Tn1. A node N2 between the transistors Tp2 and Tn4, which constitute the first inverter circuit 32, is coupled to the gates of the transistors Tp1 and Tn3, which constitute the second inverter circuit 33, and is coupled to the drain of the transistor Tn2. The level of the second high power source VDE is set to a voltage higher than the first high power source VDD level.

In the first inverter circuit 32, a P-channel MOS transistor Tp3 is used as a transistor which sets an initial value and is called an initial value setting MOS transistor. The transistor Tp3 is inserted between the transistor Tp1 and the node N1. The source of the transistor Tp3 is coupled to the drain of the transistor Tp1, the drain of the transistor Tp3 is coupled to the node N1, and the gate the transistor Tp3 is coupled to the ground. The shift circuit 12 outputs a signal Sout having the level of the node N1.

In the second inverter circuit 33, a P-channel MOS transistor Tp4 is used as a transistor which sets an initial value and is called an initial value setting MOS transistor. The transistor Tp4 is inserted between the transistor Tp2 and the node N2. The source of the transistor Tp4 is coupled to the drain of the transistor Tp2 and the drain of the transistor Tp4 is coupled to the node N2. In addition, an initial value setting circuit 34 is coupled to the gate of the transistor Tp4.

The initial value setting circuit 34 includes an inverter circuit, which has a CMOS structure. The inverter circuit includes a P-channel MOS transistor Tp5 and an N-channel MOS transistor Tn5 that are series-coupled between the second high power source VDE and the ground. The gates of the respective transistors Tp5 and Tn5 are coupled to the second high power source VDE. A node N3, which is an output end of the inverter circuit and is located between the transistors Tp5 and Tn5, is coupled to the gate of the initial value setting P-channel MOS transistor Tp4. The operation of the level converter 10 will be described herebelow. As one example, operation where the first high power VDD and the second high power VDE are being supplied will be described herebelow.

As the gates of the transistors Tp5 and Tn5 of the initial value setting circuit 34 are coupled to the second high power source VDE, the transistor Tp5 is turned OFF and the transistor Tn5 is turned ON. Therefore, the gate of the fourth transistor Tp4 of the latch circuit 31 is coupled to the ground through the transistor Tn5.

Accordingly, the respective gates of the P-channel MOS transistors Tp3 and Tp4, which are coupled between the transistors Tp1 and Tp2 of the latch circuit 31 and the nodes N1 and N2, are coupled to the ground, and hence are turned ON. More specifically, the latch circuit 31 substantially operates by the P-channel MOS transistors Tp1 and Tp2, which are coupled to the second high power source VDE, and the N-channel MOS transistors Tn3 and Tn4, which are coupled to the ground.

As one example, the case where the input signal Sin is at the first high power source VDD level will be described herein. The input circuit outputs the signal S1 having the L level and the signal S2 having the first high power source VDD level. In the shift circuit 12, the transistor Tn1 turns OFF in response to the signal S1 having the L level, and the transistor Tn2 turns ON in response to the signal S2 having the first high power source VDD level. Consequently, in the latch circuit 31, the node N2 is held at the L level, and the node N1 is held at the second high power source VDE level. The level converter 10 converts the input signal Sin having the first high power source VDD level to a signal Sout having the second high power source VDE level, and outputs the signal Sout having the second high power source VDE level.

Next, operation where the input signal Sin is the L level will be described herein. The input circuit outputs the signal S1 having the first high power source VDD level and the signal S2 having the L level. In the shift circuit 12, the transistor Tn1 turns ON in response to the signal S1 having the first high power source VDD level, and the transistor Tn2 turns OFF in response to the signal S2 having the L level. Consequently, in the latch circuit 31, the node N2 is held at the second high power source VDE level, and the node N1 is held at the L level. The level converter 10 outputs a signal Sout having the L level.

In the operation described above, the transistors Tp3 and Tp4 of the latch circuit 31 are in the ON state, and loads for the nodes N1 and N2 of the latch circuit 31 are substantially equal to each other. Therefore, even when the level of the input signal Sin transits, the potential-transitions on the nodes N1 and N2 are not influenced by the initial value setting transistor Tp3 and Tp4. More specifically, when the input signal Sin transits from the H level to the L level and when the input signal Sin transits from the L level to the H level, the rising times and falling times of the nodes N1 and N2 become substantially equal to each other. Consequently, the symmetry in the rising characteristic and falling characteristic of the signal Sout are also improved.

Figure 2:
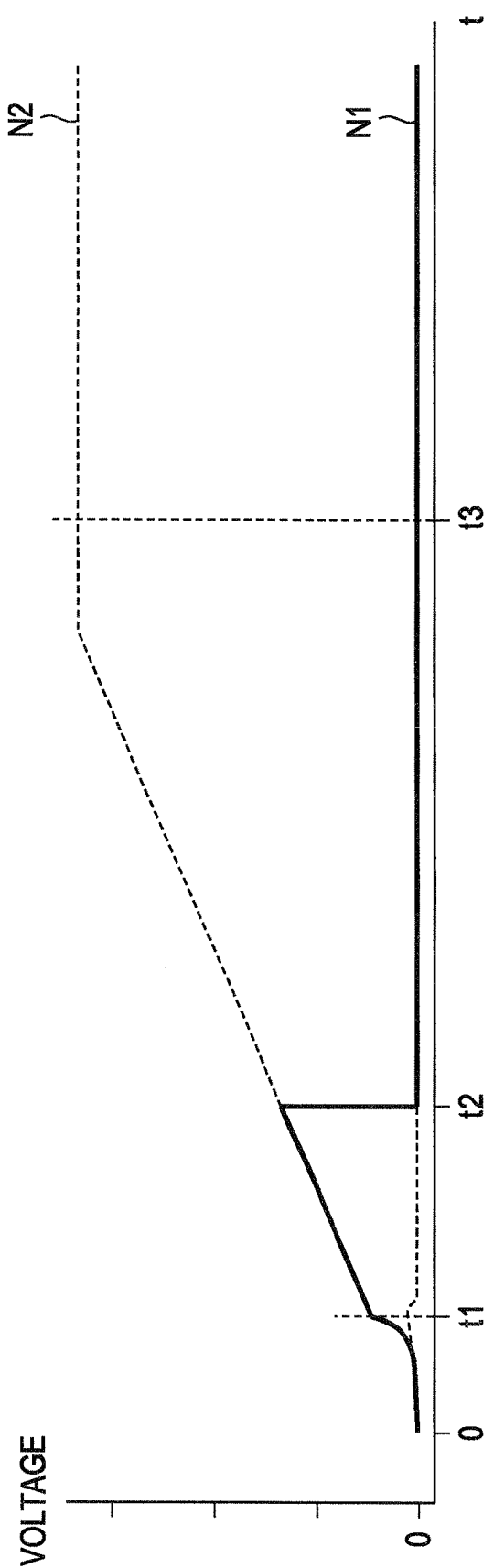
FIG. 2 is an operational waveform diagram of the level converter of the first exemplary implementation, in accordance with aspects of the present invention.

As another example, the case where the second high power source VDE is input before the first high power source VDD is input will be described herebelow with reference to FIG. 2.

When the second high power source VDE level is lower than a voltage (threshold voltage: from 0.5 to 1.0 V, for example) at which the transistors Tp5 and Tn5 of the initial value setting circuit 34 of FIG. 1 start to operate, the output level (level of the node N3) of the inverter circuit in the initial value setting circuit 34 of FIG. 1 is set to a middle level between the second high power source VDE level and the ground level. A control signal having the middle level is supplied to the gate of the transistor Tp4. The transistor Tp4 has a resistance value (R4) corresponding to the voltage level applied to the gate of the transistor Tp4. The resistance value (R4) of the transistor Tp4 is greater than a resistance value (R3) of the transistor Tp3 having the gate coupled to the ground (R4>R3).

As described above, in the serial circuit (the first inverter circuit 32), which includes the transistors Tp1, Tp3, and Tn3, and the serial circuit (the second inverter circuit 33), which includes the transistors Tp2, Tp4, and Tn4, the respective resistance values between the second high power source VDE and the ground are different from each other. Therefore, the latch circuit 31 has hysteresis characteristics. As shown at time t1 in FIG. 2, the voltage level of the node N1 is at the second high power source VDE level corresponding to the respective resistance value, and the voltage level of the node N2 is at the ground level (time t1). In addition, the voltage level of the node N1 also increases as the second high power source VDE level increases.

Subsequently, when the first high power source VDD is supplied (at time t2), the input circuit 11 of FIG. 1 starts operating. Then, in response to the level (L level in the present description) of the input signal Sin, the transistor Tn1 of the shift circuit 12 of FIG. 1 turns ON and the transistor Tn2 of the shift circuit 12 of FIG. 1 turns OFF, respectively. As shown in FIG. 2, the voltage level of the node N1 becomes the ground level, and the voltage level of the node N2 becomes the second high power source VDE level. In addition, the second high power source VDE level becomes constant after increasing up to a predetermined voltage, and similarly the potential of the node N1 becomes constant.

When the voltage supply of the first high power source VDD is stopped (at time t3), the levels of the respective output signals S1 and S2 of the input circuit 11 shown in FIG. 1 become the ground level. In this event, the latch circuit 31 supplied with the second high power source VDE maintains the voltage levels of the respective nodes N1 and N2.

The initial value setting P-channel MOS transistors Tp3 and Tp4 are, respectively, inserted between P-channel MOS transistors Tp1 and Tp2, and the nodes N1 and N2 which are the output terminals of the first and second inverter circuits 32 and 33 in the latch circuit 31 of the shift circuit 12 of FIG. 1. The gate of the P-channel MOS transistor Tp3 of the first inverter circuit 32 is coupled to the ground, and the gate of the P-channel MOS transistor Tp4 of the second inverter circuit 33 is coupled to the initial value setting circuit 34. When the second high power source VDE level is lower than or equal to a predetermined level, the initial value setting circuit 34 controls the gate potential of the MOS transistor Tp4 to a middle potential between the second high power source VDE and the ground. On the other hand, when the second high power source VDE level is higher than the predetermined level, the initial value setting circuit 34 controls the gate potential of the MOS transistor Tp4 to the ground so that the MOS transistor Tp4 turns ON.

Thus, when the supplied second high power source VDE is a fixed voltage higher than the predetermined level, the MOS transistors Tp3 and Tp4 in the first and second inverter circuits 32 and 33 turn ON. Therefore, the loads on the output terminals of the respective first and second inverter circuits 32 and 33 of the latch circuit 31 become substantially equal to each other. Consequently, even when the level of the input signal Sin transits, the potential transitions of the output ends of the first and second inverter circuits 32 and 33 are not influenced by the initial value setting MOS transistors Tp3 and Tp4. More specifically, when the input signal Sin transits from the H level to the L level and when the input signal Sin transits from the L level to the H level, the rising time and falling time of the output terminals of the first and second inverter circuits 32 and 33 become substantially equal to each other. Hence, the symmetry in the rise characteristic and fall characteristic of the output signal Sout is improved.

For example, it is provided that a level converter includes a hold circuit which holds an output signal and is provided in a circuit section that operates with a second power source voltage. Even while a first power source voltage is not being supplied, the level converter outputs an output signal corresponding to a level held in the hold circuit that operates with the second power source voltage. The level converter further includes capacitors respectively coupled to the second power source voltage and the ground. Using the capacitors, the level converter sets the signal level to be held in the hold circuit when supplying the second power source voltage. However, the capacitors work as loads on nodes to which the respective capacitors are coupled. Hence, a signal level transition period at the respective nodes, that is, a difference between the falling time from the H level to the L level and the rising time from the L level to the H level increases. Hence, a level converter such as described above cannot be used as an output circuit for outputting a signal that requires waveform symmetry. Further, the difference between the rising time and the falling time destabilizes the operation of the level converter. The first exemplary implementation overcomes this problem.

When the second high power source VDE is lower than or equal to the predetermined level, the initial value setting circuit 34 of FIG. 1 outputs the control signal having the middle level. Accordingly, the MOS transistor Tp4 of the second inverter circuit 33 has the resistance value R4 corresponding to the middle level potential thereof. In addition, since the gate of the MOS transistor Tp3 of the first inverter circuit 32 is coupled to the ground, the MOS transistor Tp3 has a resistance value R3 lower than that of the MOS transistor Tp4 of the second inverter circuit 33. Hence, in the first and second inverter circuits 32 and 33 of the latch circuit 31, the resistance values between the second high power source VDE and the ground are different from each other. Consequently, the latch circuit 31 has hysteresis characteristics, and the initial value of the latch circuit 31 can be set corresponding to the respective resistance value.

Figure 3:
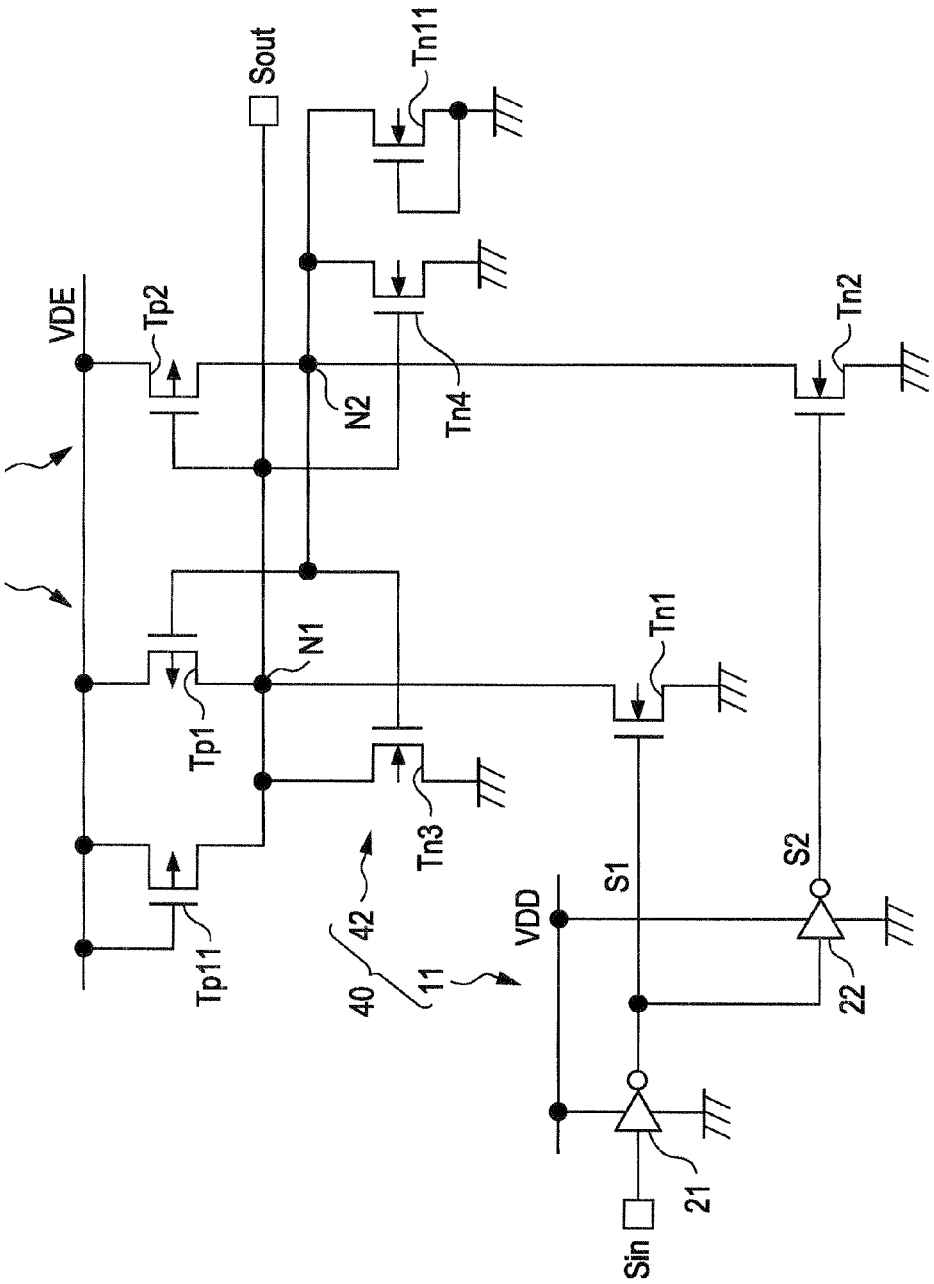
FIG. 3 is a diagram showing a second exemplary level converter circuit, in accordance with aspects of the present invention.

FIG. 3 shows a second exemplary implementation, in accordance with aspects of the present invention. In the second embodiment, the same reference characters designate the same portions as those of the first exemplary implementation, and descriptions thereof will be reduced or omitted herefrom.

As shown in FIG. 3, a level converter 40 includes an input circuit 11 and a shift circuit 42.

The input circuit 11 includes two inverter circuits 21 and 22 (first and second inverter circuits), thereby to output complementary signals S1 and S2 in accordance with the input signal Sin.

The signal S1, S2 is input into the shift circuit 42. The signal S1 is supplied to the gate of the N-channel MOS transistor Tn1, and the signal S2 is supplied to the gate of an N-channel MOS transistor Tn2. The sources of the respective transistors Tn1 and Tn2 are coupled to the ground, and the drains of the respective transistors Tn1 and Tn2 are coupled to the latch circuit 31.

The latch circuit 31 includes two inverter circuits 32 and 33 (first and second inverter circuits) coupled together in the ring shape. The first inverter circuit 32 includes the P-channel MOS transistor Tp1 and the N-channel MOS transistor Tn3 that are coupled in series between the second high power source VDE and the ground. The second inverter circuit 33 includes the P-channel MOS transistor Tp2 and the N-channel MOS transistor Tn4 that are coupled in series between the second high power source VDE and the ground. The node N1 between the transistors Tp1 and Tn3 of the first inverter circuit 32 is coupled to the gates of the transistors Tp2 and Tn4 of the second inverter circuit 33. The node N2 between the transistors Tp2 and Tn4 of the second inverter circuit 33 is coupled to the gates of the transistors Tp1 and Tn3 of the first inverter circuit 32. The second high power source VDE level is set to the voltage higher than the first high power source VDD level.

Further, the node N1 between the transistors Tp1 and Tn3 of the first inverter circuit 32 is coupled to the gates of the transistor Tp2 and Tn4 of the second inverter circuit 33, and to the drain of the transistor Tn1. The node N2 between the transistors Tp2 and Tn4 of the second inverter circuit 33 is coupled to the gates of the transistors Tp1 and Tn3 of the first inverter circuit 32, and to the drain of the transistor Tn2. The signal Sout having the level of the node N1 is output from the shift circuit 42.

The node N1 of the first inverter circuit 32 is coupled to a P-channel MOS transistor Tp11 that is used as an initial value setting P-channel MOS transistor. The node N2 of the second inverter circuit 33 is coupled to an N-channel MOS transistor Tn11 that is used as an initial value setting N-channel MOS transistor. The source and gate of the transistor Tp11 are coupled to the second high power source VDE. The drain of the transistor Tp11 is coupled to the node N1. The source and gate of the transistor Tn11 are coupled to the ground, and the drain of the transistor Tn11 is coupled to the node N2.

The operation of the level converter 40 will be described herebelow.

One exemplary operation, where the first high power source VDD and the second high power source VDE are supplied, will be described herebelow.

As the gate and source of the initial value setting transistor Tp11 are coupled to the second high power source VDE, the transistor Tp11 turns OFF. Similarly, since the gate and source of the initial value setting transistor Tn11 are coupled to the ground, the transistor Tp11 turns OFF.

Thus, also in the second exemplary implementation, the latch circuit 31 substantially operates with the P-channel MOS transistors Tp1 and Tp2, which are connected to the second high power source VDE, and with the N-channel MOS transistors Tn3 and Tn4, which are coupled to the ground. Hence, the level converter 40 converts the input signal Sin having the first high power source VDD level to a signal Sout having the second high power source VDE level, and outputs the signal Sout.

In the operation described above, the transistors Tp11 and Tn11 of the latch circuit 31 are in the OFF state, and the loads of the latch circuit 31 on the nodes N1 and N2 are substantially equal to each other. Therefore, even when the level of the input signal Sin is changing, the potential transitions of the nodes N1 and N2 are not influenced by the initial value setting transistor Tp11 and Tn11. More specifically, when the input signal Sin transitions from the H level to the L level and when the input signal Sin transitions from the L level to the H level, the rising time and falling time of the nodes N1 and N2 become substantially equal to each other. Consequently, also the symmetry of the rising characteristics and falling characteristics of the signal Sout is improved.

Another exemplary variation, where the second high power source VDE is input before the first high power source VDD is input, will be described herebelow.

When the second high power source VDE is lower than a voltage (threshold voltage: from 0.5 to 1.0 V, for example) at which the transistors Tp1, Tp2, Tn3, and Tn4 of the latch circuit 31 start to operate, leakage currents (off-leak currents) flow to the respective Tp11 and Tn11 having the OFF states. The potentials of the nodes N1 and N2 are determined in accordance with the off-leak currents flowing to the respective transistors Tp11 and Tn11. In the second exemplary implementation, the potential of the node N1 coupled to the P-channel MOS transistor Tp11 becomes the second high power source VDE level, and the potential of the node N2 coupled to the N-channel MOS transistor Tn11 becomes the ground level. The following operation is similar to the first exemplary implementation, therefore, the description is omitted.

The shift circuit 42 includes the latch circuit 31 having the first and second inverter circuits 32 and 33. The P-channel MOS transistor Tp11 is coupled between the node N1, which is the output terminal of the first inverter circuit 32, and the second high power source VDE. The N-channel MOS transistor Tn11 is coupled between the node N2, which is the output terminal of the second inverter circuit 33, and the ground. The gate of the transistor Tp11 is coupled to the second high power source VDE, and the gate of the transistor Tn11 is coupled to the ground.

Thus, when the supplied second high power source VDE is a fixed voltage higher than the predetermined level, the P-channel and N-channel MOS transistors Tp11 and Tn11 in the latch circuit 31 turns OFF. Therefore, the loads on the output terminals of the respective first and second inverter circuits 32 and 33 in the latch circuit 31 become substantially equal to each other. Consequently, even when the level of the input signal Sin transitions, the potential transitions of the output ends of the first and second inverter circuits 32 and 33 are not influenced by the initial value setting P-channel and N-channel MOS transistors Tp11 and Tn11. More specifically, when the input signal Sin transitions from the H level to the L level and when the input signal Sin transitions from the L level to the H level, the rising time and falling time of the output terminals of the first and second inverter circuits 32 and 33 become substantially equal to each other. Hence, the symmetry in the rising characteristics and falling characteristics of the signal Sout is improved.

When the second high power source VDE is lower than the voltage at which the transistors Tp1, Tp2, Tn3, and Tn4 of the latch circuit 31 start to operate, leakage currents (off-leak currents) flow to the respective P-channel MOS transistor Tp11 and the N-channel MOS transistors Tn11 having the OFF states. The potentials of the output terminal of the respective first and second inverter circuits 32 and 33 are determined in accordance with the off-leak currents flowing to the P-channel and N-channel MOS transistors Tp11 and Tn11. Consequently, the initial value of the latch circuit 31 can be determined.

Figure 4:
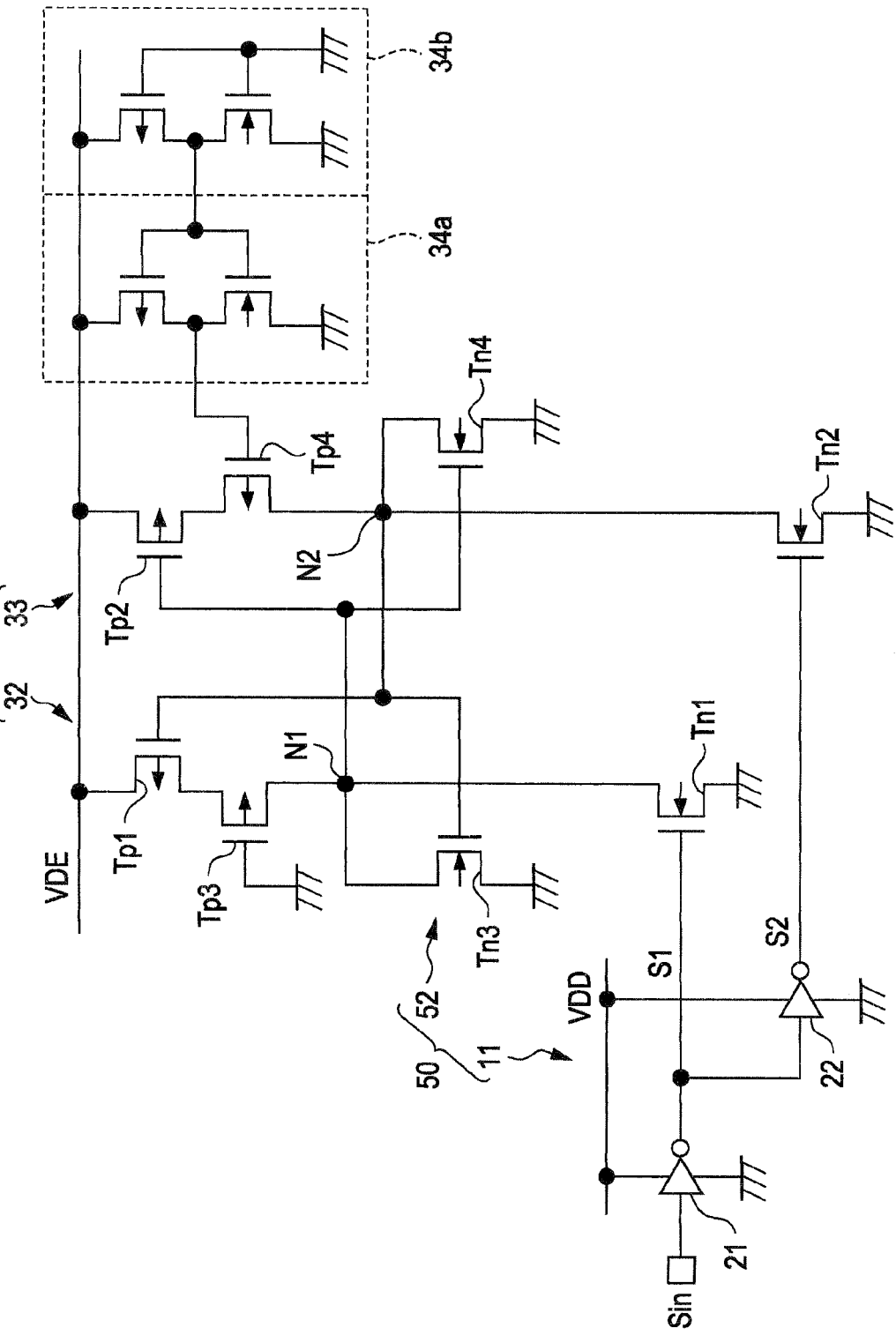
FIG. 4 is a diagram showing a third exemplary level converter circuit, in accordance with aspects of the present invention.

FIG. 4 shows a third exemplary implementation, in accordance with aspects of the present invention.

Although the initial value setting circuit 34 of the first exemplary implementation includes the single inverter circuit, the number of inverter circuits can be changed. For example, as shown in FIG. 4, a level converter 50 of the third exemplary implementation includes the input circuit 11 and a shift circuit 52. The shift circuit 52 includes an initial value setting circuit including series-coupled inverter circuits 34a and 34b. Output terminal of the inverter circuit 34a is coupled to the gate of the transistor Tp4. Gates of P-channel and N-channel MOS transistors, which gates are used as input terminals of the inverter circuit 34b, are coupled to the ground to set the gate of the transistor Tp4 to the ground level. In the level converter 50 thus configured, the initial value of the latch circuit 31 can be set, similarly as in the first exemplary implementation. Further, the level converter 50 has excellent symmetry in the rising characteristics and falling characteristics of the signal Sout.

In the shift circuit 12 of the first exemplary implementation of FIG. 1 and the shift circuit 42 of the second exemplary implementation of FIG. 3, although the node N1 is coupled to the output terminal, the node N2 may be coupled to the output terminal. In this case, the level converters output the output signal Sout having the second high power source VDE level in response to the input signal Sin having the L level, and output the output signal Sout having the L level in response to the input signal Sin having the first high power source VDD level. Thereby, a level converter that outputs the output signal Sout, which is logic-inverted relative to the input signal Sin, can be provided. Of course, it should be apparent that the nodes N1 and N2 can be coupled to different output terminals from each other.

Figure 5:
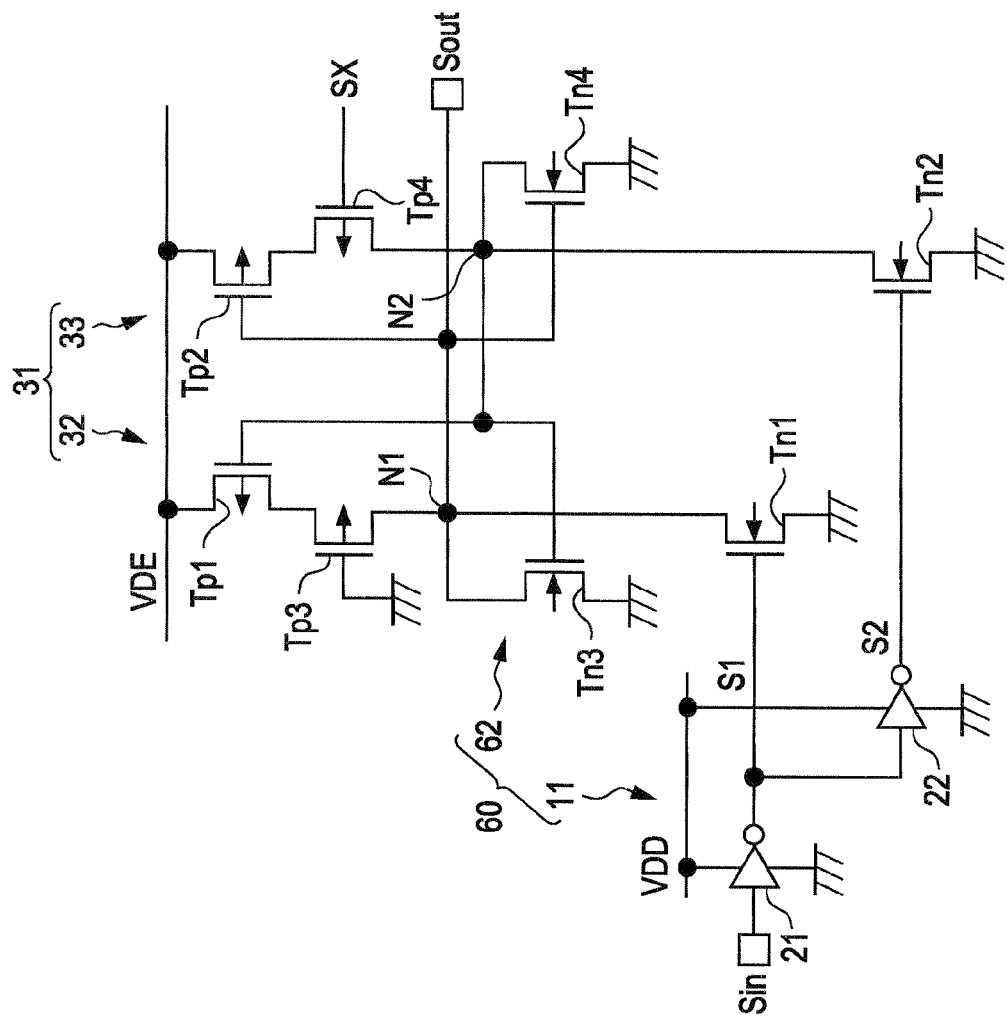
FIG. 5 is a diagram showing a fourth exemplary level converter circuit, in accordance with aspects of the present invention.

FIG. 5 shows a fourth exemplary implementation, in accordance with aspects of the present invention.

In the first exemplary implementation, though the output signal of the initial value setting circuit 34 of FIG. 1 is supplied to the gate of the transistor Tp4 of the inverter circuit 34 of FIG. 1, the gate of the transistor Tp4 may be controlled.

For example, a level converter 60 shown in FIG. 5 includes the input circuit 11 and a shift circuit 62. The shift circuit 62 includes, similar to the first exemplary implementation, the transistors Tn1 and Tn2 coupled to the latch circuit 31 and the input circuit 11, respectively. A control signal SX is input to the gate of the initial value setting transistor Tp4 in the second inverter circuit 33.

According to the fourth exemplary implementation, when the supplied second high power source VDE is a fixed voltage higher than the predetermined level, the transistor Tp3 of the first inverter circuit 32 stays in the ON state. When transistor Tp4 of the second inverter circuit 33 is turned ON by the control signal SX, the loads on the output terminals of the respective first and second inverter circuits 32 and 33 in the latch circuit 31, become substantially equal to each other.

Consequently, even when the level of the input signal Sin transitions, the potential transitions of the output terminals of the first and second inverter circuits 32 and 33 are not influenced by the initial value setting MOS transistors Tp3 and Tp4. More specifically, the rising time and falling time of the output terminals of the first and second inverter circuits 32 and 33 become substantially equal to each other. Hence, the symmetry in the rising characteristics and falling characteristics of the signal Sout is improved.

When the second high power source VDE level is lower than or equal to the predetermined level, the transistor Tp4 of the second inverter circuit 33 has a resistance value corresponding to the potential of the control signal SX. The gate of the transistor Tp3 of the first inverter circuit 32 is coupled to the ground, the transistor Tp3 has a resistance value corresponding to the gate potential. Therefore, the resistance value between the second high power source VDE and the ground in the first and second inverter circuits 32 and 33 of the latch circuit 31 can be differentiated by the voltage of the control signal SX. Thereby, the initial value of the latch circuit 31 can be determined corresponding to the voltage of the control signal SX.

Figure 6:
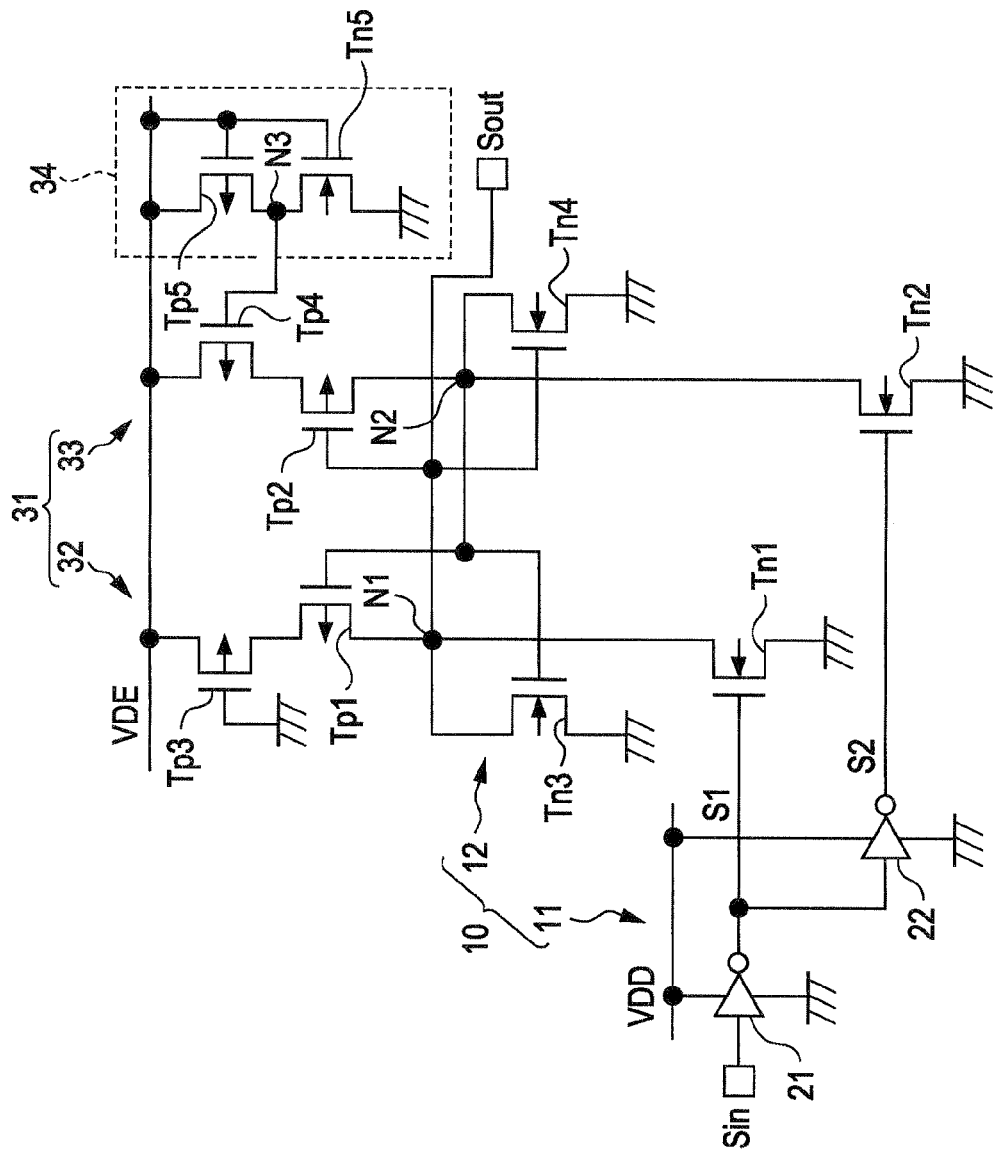
FIG. 6 is a diagram showing a fifth exemplary level converter circuit, in accordance with aspects of the present invention.

FIG. 6 shows a fifth exemplary implementation, in accordance with aspects of the present invention.

In each of the first to fourth exemplary implementations, it is sufficient to set the initial levels of the respective nodes N1 and N2. Therefore, the connection positions of the respective initial value setting P-channel MOS transistors Tp3 and Tp4 are not limited to those described in the respective exemplary implementations. For example, as shown in FIG. 6, the respective P-channel MOS transistors Tp3 and Tp4 may be inserted between the second high power source VDE and P-channel MOS transistors Tp1 and Tp2. Alternatively, the respective P-channel MOS transistors Tp3 and Tp4 may be inserted between the nodes N1 and N2 and the N-channel MOS transistors Tn3 and Tn4.

In the first exemplary implementation, the hysteresis characteristics are imparted to the latch circuit 31 of FIG. 1 to determine the initial value of the latch circuit 31. That is, in the first exemplary implementation, since it is sufficient to be set the initial levels of nodes N1 and N2, elements to be inserted are not limited to the P-channel MOS transistors. For example, N-channel MOS transistors can be inserted between the nodes N1 and N2 and the P-channel MOS transistors Tp1 and Tp2 or between the nodes N1 and N2 and the N-channel MOS transistors Tn3 and Tn4. Then, the gate potentials of the inserted N-channel MOS transistors can be controlled in accordance with the second high power source VDE level.

Further, in the first exemplary implementation, the levels of the nodes N1 and N2 are, respectively, initially set in accordance with the resistance values of the MOS transistors Tp3 and Tp4. However, elements that function as a resistance (elements having impedances) may be inserted, and the initial levels of the nodes N1 and N2 may be set by the inserted elements.

The first exemplary implementation may be alternatively configured such that the gate of the P-channel MOS transistor Tp3 of the first inverter circuit 32 is coupled to the initial value setting circuit 34, and the gate of the P-channel MOS transistor Tp4 of the second inverter circuit 33 is coupled to the ground. According to the configuration, when the second high power source VDE level is rising, the nodes N1 and N2, respectively, can be initially set to the L level and the second high power source VDE level.

Instead of the configuration of the second exemplary implementation, the initial value setting P-channel MOS transistor Tp11 may be coupled to the node N2, which is the output terminal of the second inverter circuit 33, and the initial value setting N-channel MOS transistor Tn11 may be coupled to the node N1, which is the output terminal of the first inverter circuit 32. According to the configuration, when the second high power source VDE level is rising, the nodes N1 and N2, respectively, can be initially set to the L level and the second high power source VDE level.

In the first exemplary implementation, when the supplied second high power source VDE is a fixed voltage higher than the predetermined level, the MOS transistors Tp3 and Tp4 of the respective first and second inverter circuits 32 and 33 are ON. Therefore, any one of the MOS transistors Tp3 and Tp4 may be omitted.

Figure 7:
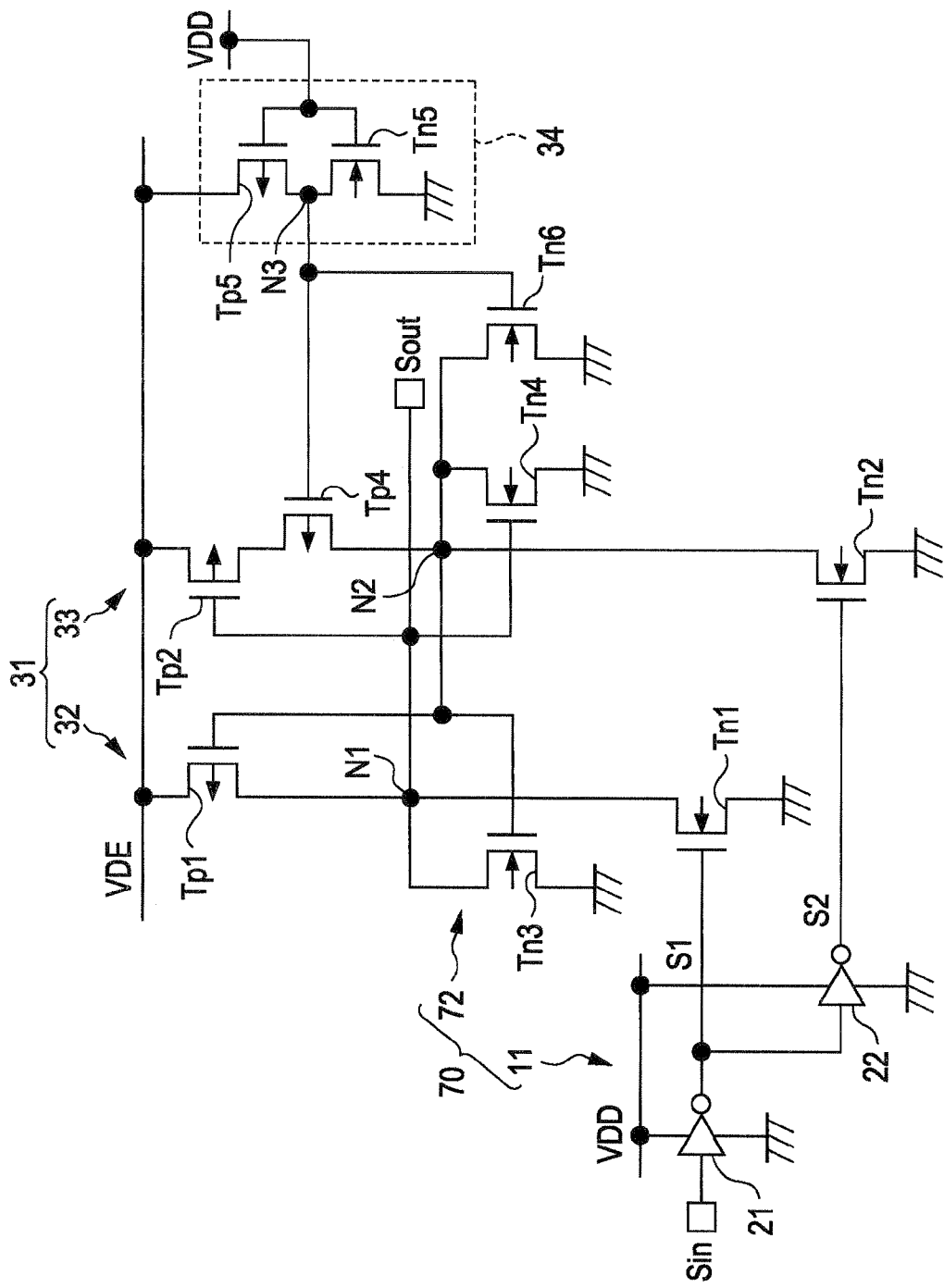
FIG. 7 is a diagram showing a sixth exemplary level converter circuit, in accordance with aspects of the present invention.

FIG. 7 shows a sixth exemplary implementation, in accordance with aspects of the present invention.

In the first exemplary implementation, the gates of the respective P-channel MOS transistor Tp5 and N-channel MOS transistor Tn5 of the initial value setting circuit 34 of FIG. 1 are coupled to the second high power source VDE. More specifically, when the supplied second high power source VDE is a fixed voltage higher than the predetermined level, it is sufficient that the voltage (at the L level) which can turn ON the P-channel MOS transistor Tp4 is output from the initial value setting circuit 34. Therefore, as shown in FIG. 7, in the case that the first high power source VDD level is higher than the threshold potential of the inverter circuit of the initial value setting circuit 34, the potential of the first high power source VDD may be supplied to the gates of the respective transistors Tp5 and Tn5 of the initial value setting circuit 34. The potentials of the first high power source VDD and the second high power source VDE may be supplied to the gates of the respective transistors Tp5 and Tn5.

Further, an N-channel MOS transistor Tn6 is coupled between the node N2 and the ground, and the gate of the transistor Tn6 may be coupled to the initial value setting circuit 34. In this case, the potential of the second high power source VDE may be supplied to the input terminal of the inverter circuit of the initial value setting circuit 34 (see FIG. 1). When the second high power source VDE level is lower than or equal to the predetermined level, the transistor Tn6 functions as a resistor in response to a control signal having the middle level supplied from the initial value setting circuit 34, thereby to determine the potential of the node N2. On the other hand, when the supplied second high power source VDE is a fixed voltage higher than the predetermined level, the gate of the transistor Tn6 becomes the L level (ground level) and turns OFF, so that the operation of the latch circuit 31 is not influenced.

A level converter 70 shown in FIG. 7 includes a shift circuit 72, which includes the P-channel MOS transistor Tp4 and the N-channel MOS transistor Tn6, and the input circuit 11. However, the level converter 70 may include an alternative shift circuit including any one of the P-channel MOS transistor Tp4 and the N-channel MOS transistor Tn6.

The N-channel MOS transistor Tn6 and the initial value setting circuit 34 may be added to level converters shown in the first to fifth exemplary implementations.

Figure 8:
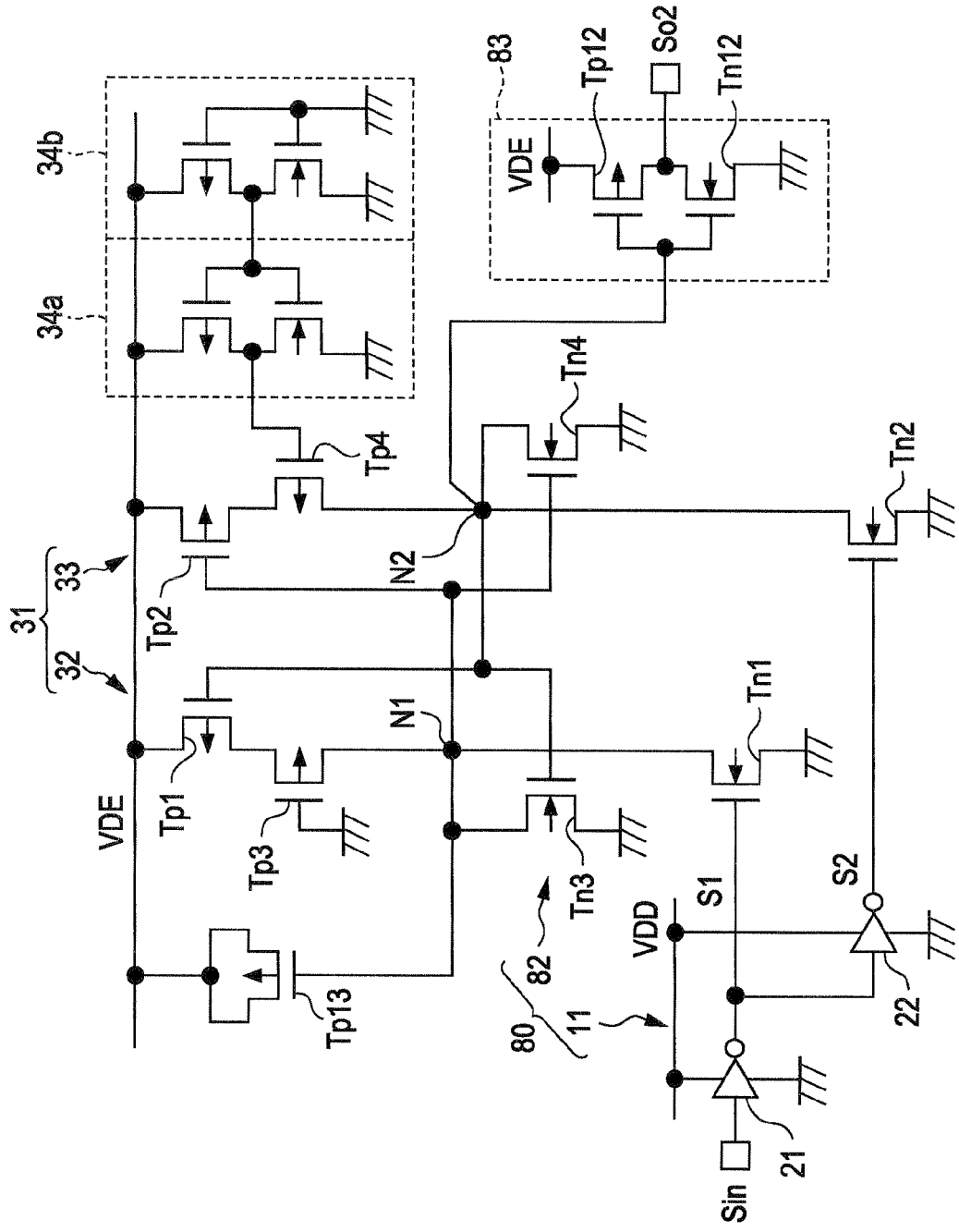
FIG. 8 is a diagram showing a seventh exemplary level converter circuit, in accordance with aspects of the present invention.

FIG. 8 shows a seventh exemplary implementation, in accordance with aspects of the present invention.

As an alternative to each of the first to sixth exemplary implementations, an input terminal of a new additional inverter circuit can be coupled to at least one of the nodes N1 and N2, which functions as the output terminals of the respective first and second inverter circuits 32 and 33, and a signal generated by level-shifting the input signal Sin can be output from an output terminal of the new additional inverter circuit.

More specifically, for example, FIG. 8 shows a level converter 80 formed by adding an inverter circuit to the level converter circuit of FIG. 4. The level converter 80 includes the input circuit 11 and a shift circuit 82, and a node N2 of the shift circuit 82 is coupled to the inverter circuit 83. The inverter circuit 83 includes a P-channel MOS transistor Tp12 and an N-channel MOS transistor Tn12 that are coupled in series between the second high power source VDE and the ground, the gates of the transistors Tp12 and Tn12 are coupled to the node N2.

The inverter circuit 83 outputs a signal So2 generated by inverting the level of the node N2. The level of the node N2 to which the inverter circuit 83 is coupled is initially set to the L level by the initial value setting circuit formed from the inverter circuits 34a and 34b. However, depending on manufacturing conditions of the manufacturing process, the level of the node N2 of a semiconductor device including the level converter 80 can be unstable. This occurs because the node N2 is coupled to the second high power source VDE due to the capacitance between the gate and source of the P-channel MOS transistor Tp12 and the node N2 is pulled up towards the second high power source VDE level when initializing. Therefore, a P-channel MOS transistor Tp13 that functions as a capacitor element is coupled between the node N1 and the second high power source VDE. The gate of the transistor Tp13 is coupled to the node N1, and the source and drain of the transistor Tp13 are coupled to the second high power source VDE.

The transistor Tp13 is formed larger than, for example, the transistor Tp12 to transfer variations in the second high power source VDE more intensively to the node N1 than the transistor Tp12. According to this configuration, the level of the node N1 can be increased earlier than the level of the node N2, thereby enabling the level of the node N2 to be secured to a level (L level) corresponding to the initial value setting circuit.

Example exemplary implementations of the present invention have now been described in accordance with the above advantages. It will be appreciated that these examples are merely illustrative of the invention. Many variations and modifications will be apparent to those skilled in the art.

In addition, the plurality of exemplary implementations described above have no order of priority.

The invention claimed is:

1. A level converter comprising:
   an input device, coupled to a low power source and a first high power source, which generates a complementary first signal and second signal in accordance with an input signal; and
   a shift circuit that outputs an output signal generated by shifting a voltage level of the input signal, the shift circuit including:
      a latch circuit having:
         a first inverter circuit provided in a first path between a second high power source and the low power source, wherein the second high power source is different from the first high power source; and
         a second inverter circuit provided in a second path between the second high power source and the low power source, wherein the latch circuit is formed by coupling an input terminal and an output terminal of the first inverter circuit and the second inverter circuit, and wherein the latch circuit latches the first signal and the second signal;
      a first transistor coupled to the first path;
      a second transistor coupled to the second path;
      a control signal line that controls a gate potential of one of the first transistor and the second transistor; and
      an initial value setting circuit coupled to the control signal line, the initial value setting circuit including a third inverter circuit disposed between the second high power source and the low power source,
   wherein the first inverter circuit includes a third transistor and a fourth transistor, one side of the third transistor coupled to the second high power source, the other side of the third transistor coupled to one side of the first transistor, one side of the fourth transistor coupled to the low power source, the other side of the fourth transistor coupled to the other side of the first transistor, and
   wherein the second inverter circuit includes a fifth transistor and a sixth transistor, one side of the fifth transistor coupled to the second high power source, the other side of the fifth transistor coupled to one side of the second transistor, one side of the sixth transistor coupled to the low power source, the other side of the sixth transistor coupled to the other side of the second transistor.

2. The level converter according to claim 1, wherein an output terminal of the third inverter circuit is coupled to one of the first transistor and the second transistor.

3. The level converter according to claim 2, wherein an input terminal of the third inverter circuit is coupled to one selected from a group consisting of the second high power source, the low power source, and the first high power source.

4. The level converter according to claim 2, wherein the initial value setting circuit includes:
   a fourth inverter circuit disposed between the second high power source and the low power source, and an input terminal of the third inverter circuit and an output terminal of the fourth inverter are coupled.

5. The level converter according to claim 1, wherein a gate potential of one of the first transistor and the second transistor is controlled in accordance with a control signal supplied through the control signal line and a resistance value of the first path and a resistance value of the second path are differentiated from each other.

6. The level converter according to claim 1, wherein, when a potential of the second high power source is lower than or equal to a predetermined level, a gate potential of one of the first transistor and the second transistor is controlled to a middle level potential between the potential of the second high power source and the low power source and wherein, when the potential of the second high power source is higher than the predetermined level, the gate potential of one of the first transistor and the second transistor is controlled to a level of the low power source.

7. The level converter according to claim 1, wherein an output terminal of the level converter is coupled to one of the first path and the second path.

8. The level converter according to claim 1, further comprising:
   an output inverter circuit that is coupled to one of the first path and the second path and that operates based on the second high power source and the low power source; and
   a capacitor element coupled between one of the first transistor and the second transistor and the second high power source.

9. The level converter according to claim 1, further comprising:
   a seventh transistor coupled between the first path and the low power source; and
   an eighth transistor coupled between the second path and the low power source.

10. The level converter according to claim 1,
wherein, when a potential of the second high power source is lower than or equal to a predetermined level, a gate potential of one of the first transistor and the second transistor is controlled to a middle level potential between the potential of the second high power source and the low power source, and
wherein, when the potential of the second high power source is higher than the predetermined level, the gate potential is controlled so that one of the first transistor and the second transistor is turned ON.

11. The level converter according to claim 10, wherein the initial value setting circuit that is coupled to a gate of one of the first transistor and the second transistor and that controls the potential of the gate in correspondence to the second high power source.

12. The level converter according to claim 10, wherein, when the potential of the second high power source is lower than or equal to a predetermined level, a resistance value of the first path and a resistance value of the second path are differentiated from each other.

13. A level converter comprising:
an input circuit, coupled to a low power source and a first high power source, which generates a complementary first signal and second signal in accordance with an input signal; and
a shift circuit that outputs an output signal generated by shifting a voltage level of the input signal, the shift circuit including:
a latch circuit having:
a first inverter circuit provided in a first path between a second high power source and the low power source, wherein the second high power source is different from the first high power source; and
a second inverter circuit provided in a second path between the second high power source and the low power source, wherein the latch circuit is formed by coupling an input terminal and an output terminal of the first inverter circuit and the second inverter circuit, and wherein the latch circuit latches the first signal and the second signal;
a first transistor coupled to the first path;
a second transistor coupled to the second path; and
a control signal line that controls a gate potential of one of the first transistor and the second transistor,
wherein the first inverter circuit includes a third transistor and a fourth transistor, one side of the third transistor coupled to one side of the first transistor, the other side of the third transistor coupled to one side of the fourth transistor, the other side of the fourth transistor coupled to the low power source, the other side of the first transistor coupled to the second high power source, and
wherein the second inverter circuit includes a fifth transistor and a sixth transistor, one side of the fifth transistor coupled to one side of the second transistor, the other side of the fifth transistor coupled to one side of the sixth transistor, the other side of the sixth transistor coupled to the low power source, the other side of the second transistor coupled to the second high power source.

14. A level converter comprising:
an input circuit, coupled to a low power source and a first high power source, which generates a complementary first signal and second signal in accordance with an input signal; and
a shift circuit that outputs an output signal generated by shifting a voltage level of the input signal, the shift circuit including:
a latch circuit having:
a first inverter circuit provided in a first path between a second high power source and the low power source, wherein the second high power source is different from the first high power source; and
a second inverter circuit provided in a second path between the second high power source and the low power source,
wherein an input terminal and an output terminal of the first inverter circuit and the second inverter circuit are coupled, wherein the latch circuit latches the first signal and the second signal;
a first element coupled to the second high power source and the first inverter circuit;
a second element coupled to the low power source and the second inverter circuit;
a control signal line that controls a gate potential of one of the first element and the second element; and
an initial value setting circuit coupled to the control signal line, the initial value setting circuit including a third inverter circuit disposed between the second high power source and the low power source,
wherein, at least when a potential of the second high power source is lower than or equal to a predetermined level, one of the first element and the second element flow current,
wherein the first inverter circuit includes a third element and a fourth element, one side of the third element coupled to the second high power source, the other side of the third element coupled to one side of the first element, one side of the fourth element coupled to the low power source, the other side of the fourth element coupled to the other side of the first element, and
wherein the second inverter circuit includes a fifth element and a sixth element, one side of the fifth element coupled to the second high power source, the other side of the fifth element coupled to one side of the second element, one side of the sixth element coupled to the low power source, the other side of the sixth element coupled to the other side of the second element.

15. The level converter according to claim 14, wherein one of the first element and the second element is a MOS transistor controlled to turn OFF when the potential of the second high power source is higher then the predetermined level.

16. The level converter according to claim 14, wherein the first element and the second element are MOS transistors, and wherein a gate of one of the first element and the second element is coupled to one of the second high power source and the low power source.

17. The level converter according to claim 14, wherein the first element and an output terminal of the level converter are coupled.

18. The level converter according to claim 14, further comprising:
a seventh element coupled between the first path and the low power source; and
an eighth element coupled between the second path and the low power source.

* * * * *